(12) United States Patent
Capodieci

(10) Patent No.: US 6,583,041 B1
(45) Date of Patent: Jun. 24, 2003

(54) MICRODEVICE FABRICATION METHOD USING REGULAR ARRAYS OF LINES AND SPACES

(75) Inventor: Luigi Capodieci, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/562,502

(22) Filed: May 1, 2000

(51) Int. Cl.[7] .......................................... H01L 21/4763
(52) U.S. Cl. ....................... 438/618; 438/128; 438/129; 438/599
(58) Field of Search ................................ 438/618–687, 438/128–129, 597–599

(56) References Cited

U.S. PATENT DOCUMENTS

| | | | |
|---|---|---|---|
| 5,118,385 A | * | 6/1992 | Kumar et al. ............... 216/105 |
| 5,415,835 A | | 5/1995 | Brueck et al. |
| 5,705,321 A | | 1/1998 | Brueck et al. |
| 5,759,744 A | | 6/1998 | Brueck et al. |
| 5,771,098 A | | 6/1998 | Ghosh et al. |
| RE36,113 E | | 2/1999 | Brueck et al. |
| 6,013,536 A | * | 1/2000 | Nowak et al. ............... 438/128 |
| 6,156,660 A | * | 12/2000 | Liu et al. ..................... 438/612 |
| 6,207,479 B1 | * | 3/2001 | Liew et al. .................. 438/129 |
| 6,255,155 B1 | * | 7/2001 | Lee et al. ..................... 438/222 |
| 6,274,934 B1 | * | 8/2001 | Shirota ........................ 257/758 |

OTHER PUBLICATIONS

US RE35,930, 10/1998, Brueck et al. (withdrawn)

* cited by examiner

*Primary Examiner*—Jey Tsai
(74) *Attorney, Agent, or Firm*—Renner, Otto, Boisselle & Sklar, LLP

(57) ABSTRACT

A method of fabricating a microdevice having the steps of forming a first regular array of lines and spaces from a first layer of material deposited on a substrate; patterning the first regular array of lines and spaces to form a first portion of a microdevice component; providing an intermediate layer over the first portion of the microdevice component; forming a second regular array of lines and spaces from a second layer of material deposited on the intermediate layer; patterning the second regular array of lines and spaces to form a second portion of the microdevice component; and forming contact holes in the intermediate layer to establish conductivity between the first portion of the microdevice component and the second portion of the microdevice component.

25 Claims, 3 Drawing Sheets

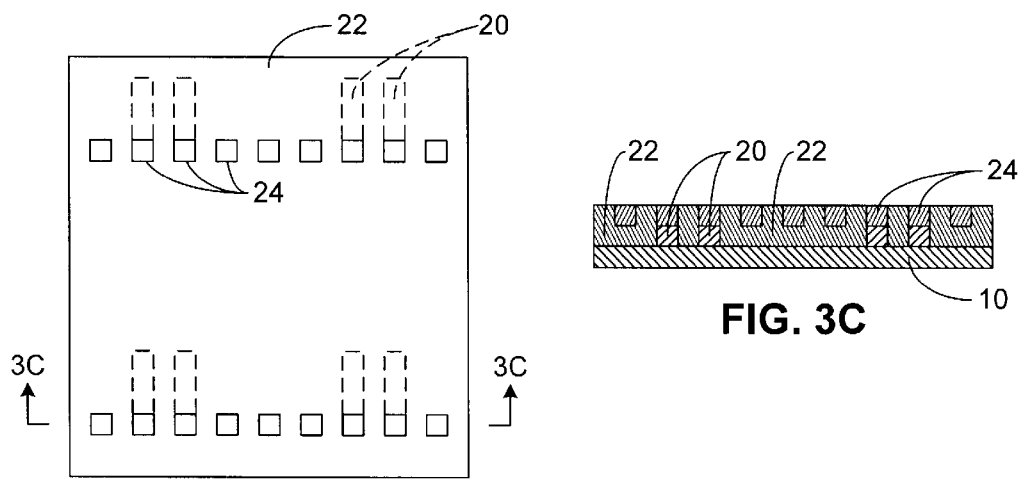
FIG. 2C
FIG. 3C
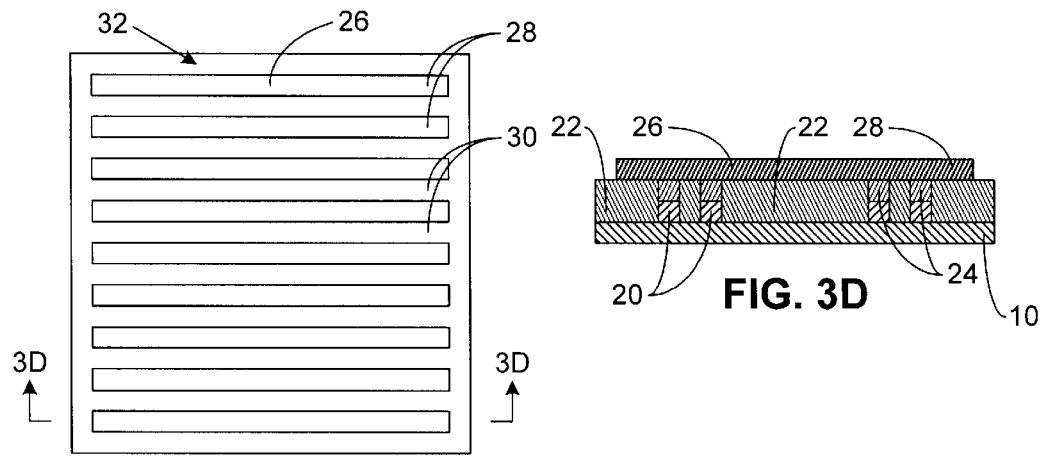
FIG. 2D
FIG. 3D
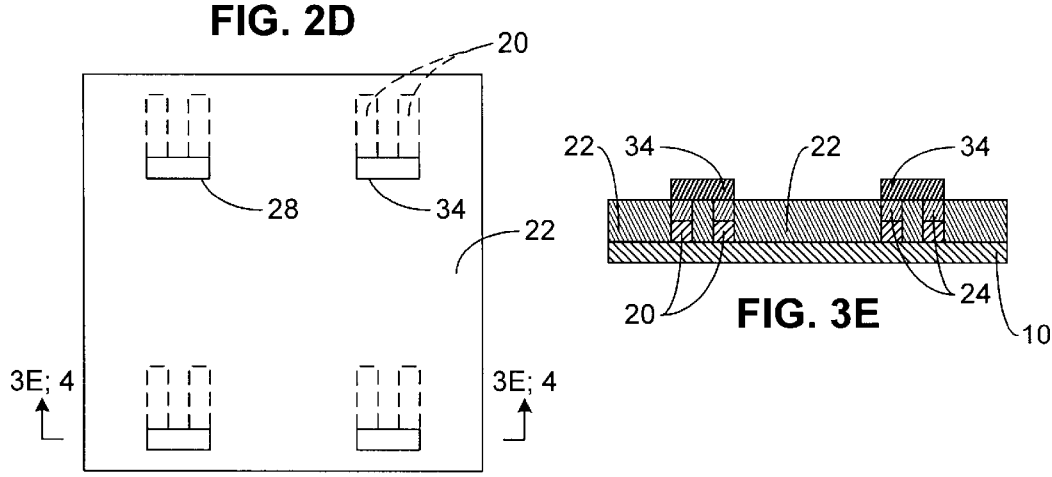
FIG. 2E
FIG. 3E

MICRODEVICE FABRICATION METHOD USING REGULAR ARRAYS OF LINES AND SPACES

TECHNICAL FIELD

The present invention generally relates to the manufacture of integrated circuits such as microprocessors and, more particularly, to a method of using arrays of lines and spaces for critical layers of a microdevice.

BACKGROUND ART

There is an ever present demand for increased resolution and uniformity when manufacturing the components of microdevices, such as microprocessors or random logic gates. Presently, device layers are patterned using optical lithography using deep ultraviolet light wavelengths of 240–248 nm, commonly referred to as DUV lithography. DUV lithography has a resolution limitation close to 1 $\mu$m. This resolution limitation hampers making devices having small critical dimensions (e.g., 100 nm or less) and results in non-uniformity from gate to gate. Phase shift masks have been used with DUV lithography, but it is very difficult to achieve high uniformity among multiple gates with phase shift masks. Uniformity is important because it is a central factor in the timing of electrical signals as the signals propagate through the gates.

Next generation lithography (NGL), such as ion or electron beam projection, may increase the resolution of current lithography techniques. However, NGL technology is in a development stage and it may be years before proposals for NGL techniques become commercially viable. Therefore, there exists a need in the art for increasing resolution and generating better critical dimension uniformity of devices made with DUV lithography.

SUMMARY OF THE INVENTION

According to one aspect of the invention, the invention is a method of fabricating a microdevice having the steps of forming a first regular array of lines and spaces from a first layer of material deposited on a substrate; patterning the first regular array of lines and spaces to form a first portion of a microdevice component; providing an intermediate layer over the first portion of the microdevice component; forming a second regular array of lines and spaces from a second layer of material deposited on the intermediate layer; patterning the second regular array of lines and spaces to form a second portion of the microdevice component; and forming contact holes in the intermediate layer to establish conductivity between the first portion of the microdevice component and the second portion of the microdevice component.

According to another aspect of the invention, the invention is a method of fabricating a microdevice, comprising the steps of providing a substrate; providing a uniform layer of material on the substrate; forming a regular array of lines and spaces from the layer of material; patterning the regular array of lines and spaces; forming a microdevice component on the substrate adjacent the patterned regular array of lines and spaces; and connecting the microdevice component to the patterned regular array of lines and spaces.

BRIEF DESCRIPTION OF DRAWINGS

These and further features of the present invention will be apparent with reference to the following description and drawings, wherein:

FIGS. 2A through 2E are top views of the example microdevice formed using the method of the present invention in intermediate stages of manufacture.

FIGS. 3A through 3E are cross-sectional view of the example microdevice formed using the method of the present invention in intermediate stages of manufacture taken along the lines 3A—3A through 3E—3E in FIGS. 2A through 2E respectively.

DISCLOSURE OF INVENTION

Figure 1:
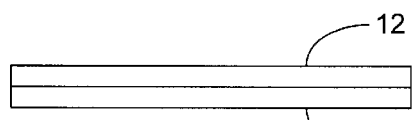
FIG. 1 is an end view of an example microdevice formed using a method of the present invention in an intermediate stage of manufacture.

In the detailed description which follows, identical components have been given the same reference numerals, regardless of whether they are shown in different embodiments of the present invention. In order to clearly and concisely illustrate the present invention, the drawings may not necessarily be to scale and certain features may be shown in somewhat schematic form.

In the preferred embodiment, the method of the present invention is used in conjunction with a process for fabricating a microdevice, such as the advanced gates in a random logic processor or a microprocessor. However, it will be appreciated that the invention has application with other microdevices which rely on a high degree of resolution and uniformity. Throughout the following description, the method according to the present invention will be described with reference to the fabrication of an example series of components, or gates, where each component has a "U" shape when viewed from the above. As will described in more detail below, vertical lines are used to make the legs of the U-shaped components and horizontal lines are used to make the base of the U-shaped components. It should appreciated that the U shaped configuration of the example components is merely intended to be exemplary and devices made using the method of the present invention can take on any configuration selected by the microdevice designer.

Referring initially to FIG. 1, the process in accordance with the present invention begins with providing a substrate 10. The substrate 10 is made from any suitable material, such as silicon oxide, and will depend on the device being fabricated. Next, a first layer of material used to form a regular array of lines and spaces is uniformly deposited on the substrate 10. The first layer is made from a material suitable for the microdevice being fabricated, such as polycrystalline silicon (often times referred to as a "POLY1" layer). It is noted that depending on the device being fabricated other layers may be provided in addition to the first layer, such as an insulator or a tunnel oxide layer. For clarity, these layers will be omitted and the present discussion will focus on the layers whose fabrication is most dependent upon the techniques of the present invention. Since the fabrication of microdevices with a POLY1 layer is very common, the rest of the discussion herein will refer to a POLY1 layer 12. The POLY1 layer 12 is deposited uniformly over a desired area of the substrate 10. POLY1 layer 12 can be deposited with techniques such as low pressure chemical vapor deposition ("LPCVD"). The POLY1 layer 12 preferably has a thickness in the range 10 nm to 200 nm. POLY1 layer 12 is suitably doped as required by the device being fabricated and using a method such as diffusion doping or ion implantation doping.

Figure 2A:
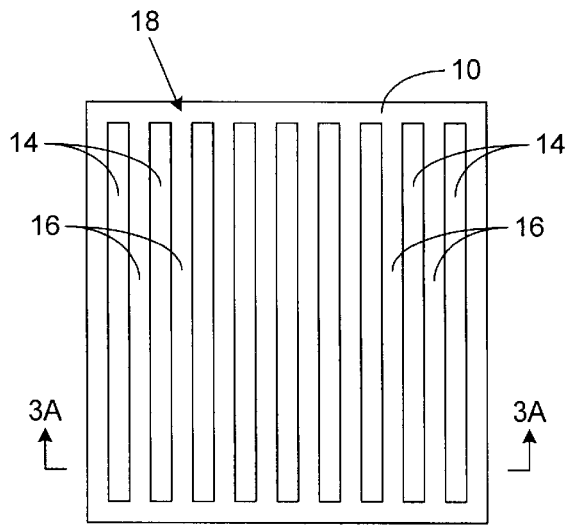
Figure 3A:
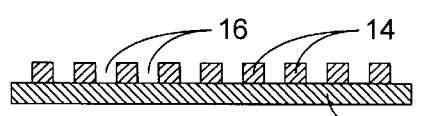

Referring to FIGS. 2A and 3A, the POLY1 layer 12 is patterned to provide a regular array 18 of parallel lines 14 of POLY 1 layer material in a very high density over an area of the substrate 10. As will be discussed in more detail below, the lines 14 may be formed uniformly over the desired area even if all of the lines 14 will not be used. More specifically, each line 14 in the array 18 has substantially the same width as every other line and each space 16 has substantially the same width as every other space. The lines 14 and spaces 16 are patterned to have a regular pitch, or pitch ratio of lines to spaces. The pitch ratio of the lines to spaces can be selected to be 1:1 so that each line 14 has substantially the same line width and the space 16 between each line is substantially the same. Alternatively, the pitch ratio can be adjusted so that the line width and space width are not equal. The pitch ratio will be a function of the requirements of the specific microdevice being fabricated and decisions made by the microdevice designer. Example pitch ratios are 1:1.25, 1:1.5 and 1:2. Briefly referring to FIG. 5, horizontal interconnect runs 42 have a pitch ratio of 1:2 since the spaces between the runs 42 are twice as wide as the lines forming runs 42.

The arrays can be patterned by using one of a variety of techniques, including interferometric lithography, chromeless phase shifted mask, and electron beam lithography. Some example interferometric lithography techniques are disclosed in U.S. Pat. Nos. 5,415,835, 5,705,321, 5,759,744, 5,771,098, Re. 35,930 and Re. 36,113, the disclosures of which are herein incorporated by reference in their entireties. Interferometric lithography can achieve sub 100 nm resolution using an original light wavelength of 240–248 nm. Therefore, the regular array of lines 14 and spaces 16 can be patterned using much of the same equipment used for deep ultraviolet (DUV) lithography. As one skilled in the art will appreciate, other light wavelengths can also be used.

The line width can be made as small as the resolution of the interferometric lithography will permit, but the line width is preferably in the range of 50 nm to 200 nm. The width of the spaces 16 can also be made as small as the resolution of the patterning technique will permit, but is preferably in the range of 70 nm to 250 nm. As one skilled in the art will appreciate, the line 14 width and the space 16 width for any particular microdevice is dependent upon the microdevice being fabricated.

As mentioned, the POLY1 layer 12 is patterned into a regular array of lines 14 and spaces 16 in a direction chosen by the designer (e.g., vertical horizontal or diagonal). As exemplified in FIG. 2A, the lines are all oriented in a vertical direction resulting in the vertical array 18. The illustrated array 18 of vertical lines 14 as drawn in FIG. 2A has only nine lines; however, it should be appreciated that hundreds or thousands of lines 14 are preferably patterned at the same time to form the regular array of lines.

Figure 2B:
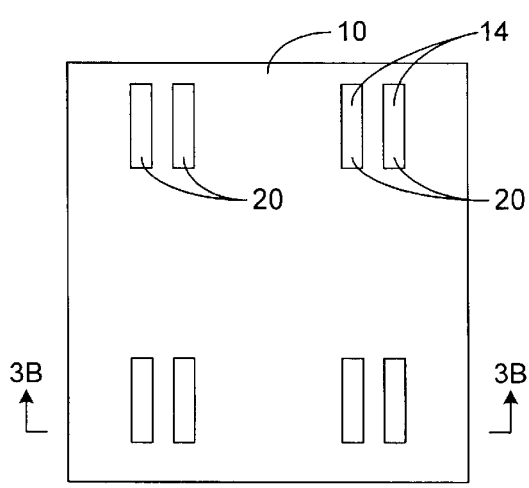
Figure 3B:
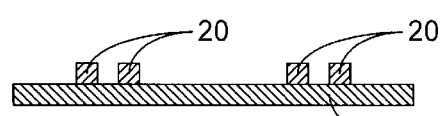

Referring to FIGS. 2B and 3B, the array of vertical lines 18 is patterned using subtractive patterning to achieve the desired layout for the POLY1 layer 12. Lines which are not desired can be removed and the desired lines 14 can sized, or shortened, to a desire length, for example a length of 180 to 5,000 nm and above. The subtractive patterning can be accomplished by known masking techniques. It is noted that the resolution of the masking process used for the subtractive patterning may be lower than the resolution of the interferometric lithography used for patterning the array of vertical lines 18. Therefore, as many of the undesired lines 14 as possible should be removed, but some unused lines, or dummy lines, may be left between or next to lines 14 which are used to form the desired components after the subtractive patterning is completed.

As illustrated in FIGS. 2B and 3B, portions of the lines 14 have been left. Following the example, the remaining portions of the lines 14 form the legs 20 of the U-shaped components. The line width of the legs 20 will be the same as the line width of the lines 14. The space between the legs 20 will have the same width as the spaces 16, unless dummy lines are present between the legs 20. After the array 18 has been patterned using the subtractive patterning described above, additional layers used to form microdevice components may be deposited and patterned on other areas of the substrate as required. These other layers may not require the resolution or uniformity of the components being fabricated from the uniform array of lines 14. Alternatively, another uniform array of lines may be formed on the substrate using the same techniques as described above. This other array can have the same or different line widths, space widths and pitch ratio as the array 18.

Referring to FIGS. 2C and 3C, an intermediate layer, or insulating layer 22 is deposited over the substrate and the remaining portion of the POLY1 layer 12. Depending on the device being fabricated, other layers may also be deposited or used instead of the insulation layer 22, such as a multilayer interpoly dielectric made from a three-layer structure of oxide/nitride/oxide (ONO).

Continuing with FIGS. 2C and 3C, vias, or contact holes 24, are formed in the insulating layer 22. The holes are formed using a conventional binary mask or a phase shift mask. The holes have a pitch in the horizontal direction and a pitch in the vertical direction. The horizontal pitch and the vertical pitch for the holes 24 may or may not be the same. The horizontal pitch is selected so that the holes 24 coincide with the horizontal position of the lines 14 of the vertical array 18. The vertical pitch of the holes 24 is selected to coincide with the intersection of the lines 14 and subsequent component layers, as will be discussed in more detail below.

The holes 24 are preferably arranged with a regular horizontal pitch and a regular vertical pitch rather than just being positioned as needed. This is done so that there is a greater likelihood that all of the necessary holes will open. As one skilled in the art will appreciate, when holes are positioned with varying densities it is difficult to control all of the holes and some of them will open but some of them will not. The use of regular arrays of lines such as the array 18 of vertical lines 14 facilitates the use of holes having a regular pitch in the horizontal direction and the vertical direction. However, holes 24 will be formed in the insulating layer 22 which are not required. The unused holes 24 can be filled with insulation and the holes 24 which are used to connect various layers of the components being fabricated are filled with a metal, such as copper. Alternatively, all the holes 24 can be filled with metal and the unused holes 24 can later be etched away and replaced by a replacement insulation layer.

Referring now to FIGS. 2D and 3D, a second layer of material used to form a regular array of lines and spaces, such as polycrystalline silicon (referred to herein as "POLY2" layer 26), is uniformly formed on the insulating layer 22 and over the contact holes 24. The POLY2 layer 26 is deposited using, for example, LPCVD techniques as are known. The POLY2 layer 26 may also include a silicide such tungsten silicide ($WSi_2$) or titanium silicide ($TiSi_2$). The POLY2 layer 26 preferably has thickness in the range of 20 nm to 400 nm and can optionally be doped using techniques such as diffusion doping or ion implantation doping.

The POLY2 layer 26 is then patterned using one of a variety of techniques, including interferometric lithography, chromeless phase shifted mask, and electron beam lithography. As with the POLY1 layer 12, the POLY2 layer 26 is patterned into a regular array of parallel lines 28 and spaces 30. The lines may be arranged vertically, horizontally or diagonally as required by the microdevice being fabricated. Each line 28 has the same width, preferably in the range of 50 nm to 200 nm and the spaces 30 each have the same width preferably in the range of 70 nm to 250 nm. The lines 28 and spaces 30 are patterned to have a regular pitch, or pitch ratio of lines to spaces. The pitch ratio of the lines to spaces can be selected to be 1:1 so that each line 28 has substantially the same line width and the space 30 between each line is substantially the same. Alternatively, the pitch ratio can be adjusted so that the line width and space width are not equal. The pitch ratio will be a function of the requirements of the specific microdevice being fabricated and decisions made by the microdevice designer. Example pitch ratios are 1:1.25, 1:1.5 and 1:2.

In the illustrated example of forming a U-shaped component, the lines 28 and spaces 30 form an array 32 of horizontal lines 28. The array 32 of horizontal lines 28 are preferably positioned so that the lines intersect the holes 24 used to connect the POLY2 layer 26 to the POLY1 layer 12. This way, an electrical connection can be made between the lines 28 of the POLY2 layer 26 and the lines 14 of the POLY1 layer 12. It should be apparent that if a connection between the layers 12, 26 is not desired, the holes 24 should be omitted.

Referring now to FIGS. 2E and 3E, the array of horizontal lines 32 is further patterned by subtractive patterning. Subtractive patterning removes any unwanted lines 28 and can be used to reduce the length of the remaining lines to a desired length. Following the example, the lines 28 are patterned to form the bases 34 of the U-shaped components. The ends of the bases 34 are positioned over the contact holes 24 which will connect the bases 34 to the legs 20. Additional layers, such as an insulating layer, can then be deposited.

The present invention allows for the forming of microdevices with uniformly wide lines of material having narrow widths, such as under 100 nm, and the lines being spaced apart at regular intervals, spaces having a width under 250 nm. This allows the formation of uniformly sized sets of gates, or other components, where each gate or component is sized substantially the same as to every other gate or component, thereby minimizing electrical signal propagation differentials through each of the gates or component. Fabricating microdevices using the method of the present invention results in better resolution, thereby facilitating the fabrication of devices with small critical dimensions (CD), for example under 150 nm. One method of patterning the regular array of lines and spaces as described herein is by using interferometric lithography where two plane waves interfere through a diffraction grating to pattern a layer of resist used in the formation of the array of vertical lines 18 or the array of horizontal lines 32. Once the array of lines 18, 32 are made using interferometric lithography, the arrays 18, 32 are patterned using traditional lithography and masking techniques.

Figure 6:
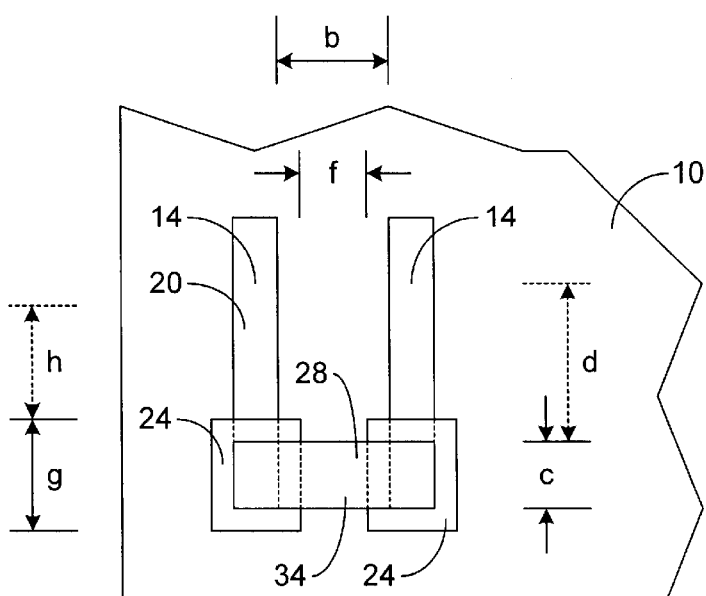
FIG. 6 is a schematic top view of an example microdevice formed using the method of the present invention.

FIG. 6 is an illustrative example of the formation of a U-shaped component where the pitch ratios of the arrays 18, 32 and the holes are not 1:1. It is noted that the figures, including FIG. 6, are not necessarily to scale. In addition, some layers are not shown in FIG. 6 for clarity. In the example of FIG. 6, the vertical lines 14 forming the legs 20 have a width (distance a) of 70 nm and a space (distance b) of 105 nm, resulting in a pitch of 1:1.5. The horizontal line 28 forming the base 34 has a width (distance c) of 100 nm and a space (distance d) of 200 nm, resulting in a pitch of 1:2. The contacts, or holes 24, have a dimension of 90 nm by 140 nm formed in the horizontal direction with a width (distance e) of 90 nm and a space (distance f) of 85 nm (i.e., a pitch of 1:0.94). The contacts are formed in the vertical direction with a width (distance g) of 140 nm and a space (distance h) of 140 nm (i.e., a pitch of 1:1). It is noted that distance d and h are shown in phantom since, in this example, the adjacent horizontal line and vertical contact were removed to formed the U-shaped component. It is also noted that the oversizing of the contacts is illustrative of the possibility that the resolution for the contacts can be less than the resolution of the lines and spaces. Therefore, the contacts can often be formed with older generation lithography equipment and techniques.

Figure 4:
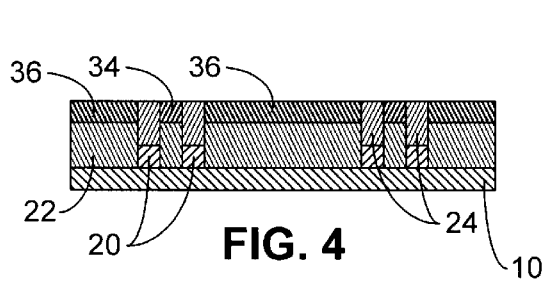
FIG. 4 is a cross-sectional view of the example microdevice formed using a modified method of the present invention taken along the line 4—4 in FIG. 2E.

Referring to FIG. 4, the U shaped example microdevice component is made according to a modified fabrication method according to the present invention. As described above, the substrate 10 is provided on which an array 18 of vertical lines 14 is formed as illustrated in FIGS. 2A and 3A. The array of vertical lines is patterned to form the legs 20 as illustrated in FIGS. 2B and 3B. Next, an insulating layer 22 is deposited. However, before the contact holes 24 are provided in the insulating layer 22, the array 32 of horizontal lines 28 is formed on the insulating layer 22 and patterned to form the bases 34 as illustrated in FIGS. 2E and 3E. Next, a second insulating layer 36 is deposited. After the insulating layer 36 is deposited, contact holes 24 are formed to connect the ends of the bases 34 to the legs 20. The contact holes 24 are formed and filled in the same manner as described above. However, the contact holes 24 will be positioned so that the holes 24 will replace at least a portion of the ends of the bases 34 and traverse the insulating layer 22 as illustrated in FIG. 4.

Figure 5:
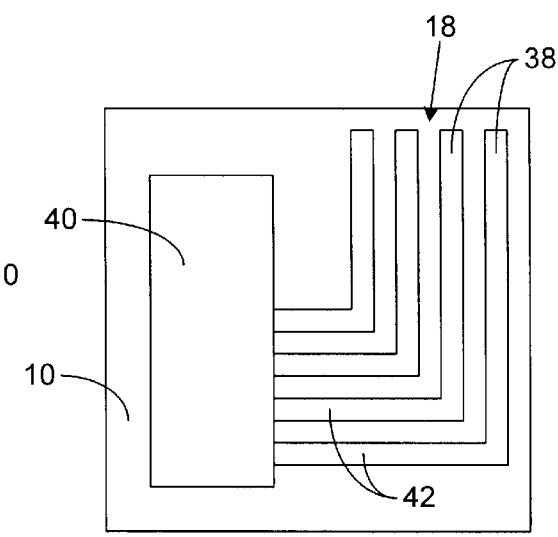
FIG. 5 is a top view of a microdevice having conductor runs fabricated using the method of the present invention.

In addition to being used in cooperation with one another to form a component for a microdevice, the array 18 of vertical lines 14 or the array 32 of horizontal lines 28 can be used by themselves to provide other structure for the microdevice. An example is a series of conductor runs used to establish electrical connection to components having less stringent critical dimension requirements. Referring to FIG. 5, an array 18 of vertical lines is formed on substrate 10 using the techniques described herein and then patterned to form vertical conductor runs 38. Each vertical conductor run 38 can be of a different length. Non-critical components 40 can then be deposited on a separate area of the substrate 10. Interconnects 42 to connect the non-critical components 40 to the vertical conductor runs 38 can then be formed on the substrate 10. It is noted that the interconnects 42 could be formed before the non-critical components 40. Alternatively, the interconnects 42 could be formed using an array of horizontal lines using the techniques described herein. In another alternative, the array 18 of vertical lines can be formed on the substrate 10 and then patterned to form the vertical conductor runs 38. Next, a layer of insulating material can be deposited, upon which the array of horizontal lines can be formed. The array of horizontal lines is then be patterned to form the interconnects 42. Contact holes 24 are also formed to connect the vertical conductor runs 38 to the horizontal inter connect runs 42. It is noted that the contact holes 24 can be made in the insulating layer before or after the array of horizontal lines 32 are formed in accordance with the above description.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a plurality of microdevices, comprising the steps of:

forming a first regular array of lines and spaces from a first layer of material formed on a substrate, wherein widths of all of the lines of the first regular array are substantially the same as a first line width and widths of all of the spaces of the first regular array are substantially the same as a first space width;

patterning the first regular array of lines and spaces to form a plurality of first microdevice components, each first microdevice component corresponding to one of the plurality of microdevices;

providing an intermediate layer over the first microdevice components;

forming a second regular array of lines and spaces from a second layer of material formed on the intermediate layer, wherein widths of all of the lines of the second regular array are substantially the same as a second line width and widths of all of the spaces of the second regular array are substantially the same as a second space width;

patterning the second regular array of lines and spaces to form a plurality of second microdevice components, each second microdevice component corresponding to one of the plurality of first microdevice components; and forming contact holes in the intermediate layer to establish conductivity between each associated first microdevice component and second microdevice component.

2. The method according to claim 1, wherein the contact holes are formed before the second regular array of lines and spaces is formed.

3. The method according to claim 1, wherein the contact holes are formed after the second regular array of lines and spaces is formed.

4. The method according to claim 1, wherein the first regular array of lines and spaces are arranged in a first direction and the second regular array of lines and spaces are arranged in a second direction perpendicular to the first direction.

5. The method according to claim 4, wherein the contact holes are arranged in a matrix having a pitch in the first direction and a pitch in the second direction, the pitch in the first direction aligned with the lines of the second regular array of lines and spaces, and the pitch in the second direction aligned with the lines of the first regular array of lines and spaces.

6. The method according to claim 1, wherein the first and second regular arrays of lines and spaces are made from polycrystalline silicon.

7. The method according to claim 1, wherein the first line width of the first regular array lines and spaces is less than 100 nm.

8. The method according to claim 1, wherein the first space width of the first regular array of lines and spaces is less than 150 nm.

9. The method according to claim 1, wherein the second line width of the second regular array lines and spaces is less than 100 nm.

10. The method according to claim 1, wherein the second space width of the second regular array of lines and spaces is less than 150 nm.

11. The method according to claim 1, wherein a pitch of the first regular array is equal to a pitch of the second regular array.

12. The method according to claim 1, wherein a pitch of the first regular array is not equal to a pitch of the second regular array.

13. The method according to claim 1, wherein at least one of the first regular array or the second regular array is formed using interferometric lithography.

14. The method according to claim 1, wherein at least one of the first regular array or the second regular array is patterned using subtractive patterning.

15. The method according to claim 1, further comprising the step of forming an additional microdevice component on the substrate adjacent the microdevice components made from the first and second regular arrays of lines and spaces.

16. A method of fabricating a microdevice, comprising the steps of:

providing a substrate;

providing a uniform layer of material on the substrate;

forming a regular array of lines and spaces from the layer of material, each of the lines having a width substantially the same as every other line of the regular array and each of the spaces having a width substantially the same as every other space of the regular array;

patterning the regular array of lines and spaces to form a set of interconnects;

forming a plurality of microdevice components on the substrate adjacent the patterned regular array of lines and spaces; and connecting each microdevice component to at least one interconnect.

17. The method according to claim 16, wherein the microdevice components and the interconnects are connected via a second patterned regular array of lines and spaces, wherein each of the lines of the second regular array have a width substantially the same as every other line of the second regular array and each of the spaces of the second regular array have a width substantially the same as every other space of the second regular array.

18. The method according to claim 1, wherein during patterning of the first regular array of lines and spaces, at least one line from the first regular array of lines and spaces is completely removed.

19. The method according to claim 18, wherein during patterning of the second regular array of lines and spaces, at least one line from the second regular array of lines and spaces is completely removed.

20. The method according to claim 1, wherein during patterning of the second regular array of lines and spaces, at least one line from the second regular array of lines and spaces is completely removed.

21. The method according to claim 1, wherein during patterning of the first regular array of lines and spaces, at least a portion of at least one line from the first regular array of lines and spaces is left intact as a dummy structure.

22. The method according to claim 21, wherein during patterning of the second regular array of lines and spaces, at least a portion of at least one line from the second regular array of lines and spaces is left intact as a dummy structure.

23. The method according to claim 1, wherein during patterning of the second regular array of lines and spaces, at least a portion of at least one line from the second regular array of lines and spaces is left intact as a dummy structure.

24. The method according to claim 16, wherein during patterning of the first regular array of lines and spaces, at least one line from the first regular array of lines and spaces is completely removed.

25. The method according to claim 16, wherein during patterning of the first regular array of lines and spaces, at least a portion of at least one line from the first regular array of lines and spaces is left intact as a dummy structure.

* * * * *